United States Patent [19]

Knight et al.

[11] Patent Number: 4,849,373
[45] Date of Patent: Jul. 18, 1989

[54] GROWTH OF SEMI-INSULATING INDIUM PHOSPHIDE BY LIQUID PHASE EPITAXY

[75] Inventors: D. Gordon Knight, Munster Hamlet; William Benyon, Nepean, both of Canada

[73] Assignee: Northern Telecom Limited, Montreal, Canada

[21] Appl. No.: 201,155

[22] Filed: Jun. 2, 1988

[51] Int. Cl.[4] .................... H01L 21/208; H01L 21/20
[52] U.S. Cl. .................................... 437/129; 437/130; 437/133; 437/91; 437/92; 148/DIG. 101; 148/DIG. 23; 148/DIG. 95; 148/DIG. 66; 357/16; 357/17; 357/63; 156/621
[58] Field of Search ............... 437/129, 130, 90, 91, 437/92, 133; 148/DIG. 23, DIG. 66, DIG. 95, DIG. 101; 156/621, 624; 357/16, 17, 63

[56] References Cited

U.S. PATENT DOCUMENTS 4,774,554  9/1988  Dentai et al. .......................... 357/17

FOREIGN PATENT DOCUMENTS 2598862  11/1987  France .
155718    6/1988  Japan .

OTHER PUBLICATIONS

Dutta et al. (Appl. Phys. Lett. 48(23), pp. 1572–1573, Jun. 9, 1986.
Dutta et al., Appl. Phys. Lett. 50(11), pp. 644–646, Mar. 16, 1987).
Rezek et al. (Appl. Phys. Lett. 43(4), pp. 378–380, Aug. 15, 1983).
Lambert et al. (Semicond. Sci. Technol. 2 (1987), pp. 78–82.
Nakahara et al. (J. Crystal Growth 72, p. 693, 1985).
Iseler et al. (Appl. Phys. Lett. 48(24), pp. 1656–1657, Jun. 16, 1986).
Rezek et al. (Proceedings of the 3rd NATO Workshop on Materials Aspects of InP, Harwichport Massachusetts, 1986).
Zah et al., "High Speed 1.3 μm GaInAsP p-Substrate Buried-Crescent Lasers with Semi-Insulating Fe/Ti-Doped InP Current Blocking Layers", Electronics Letters, vol. 24, No. 11, May 26, 1988, pp. 695–697.
Coquille et al., "Synthesis, Crystal Growth and Characterization of InP", J. Crystal Growth, vol. 64, 1983, pp. 23–31.

Primary Examiner—Olik Chaudhuri
Assistant Examiner—M. Wilczewski
Attorney, Agent, or Firm—C. W. Junkin

[57] ABSTRACT

In a method for Liquid Phase Epitaxy (LPE) of semi-insulating InP, a solution of P, Ti and a p-type dopant in molten In is cooled in a non-oxidizing ambient at a surface of a substrate to grow an epitaxial layer of doped InP on the surface. The concentration of p-type dopant in the solution is such as to provide a concentration of p-type dopant in the grown epitaxial layer greater than the aggregate concentration of any residual contaminants in the grown epitaxial layer, and the concentration of Ti in the solution is such as to provide a concentration of Ti in the grown epitaxial layer greater than the concentration of p-type dopant in the grown epitaxial layer. The required melt concentrations are determined empirically. The method can be performed at temperature below 650 degrees Celsius and is particularly suited to the LPE growth of semi-insulating InP to isolate InP-InGaAsP buried heterostructure lasers.

19 Claims, 2 Drawing Sheets

GROWTH OF SEMI-INSULATING INDIUM PHOSPHIDE BY LIQUID PHASE EPITAXY

FIELD OF THE INVENTION

This invention relates to the growth of semiinsulating insulating InP by Liquid Phase Epitaxy (LPE).

BACKGROUND OF THE INVENTION

In the fabrication of buried heterostructure semiconductor lasers, a series of doped epitaxial layers are grown on a semiconductor substrate to define a heterostructure. Regions of the epitaxial layers are etched back to define an isolated mesa in the heterostructure which functions as an active region of the completed laser. The etched regions are covered with isolating material to planarize the structure, and contacts are formed to the active region and to the substrate. End facets are cleaved on the active region to complete the laser fabrication.

The isolating material used to planarize the structure must be compatible with the crystal structure of the heterostructure to avoid mechanical stresses leading to reliability problems and to avoid the formation of surface states which could act as recombination centers reducing the efficiency of the completed laser. The isolating material must also have a refractive index lower than that of the active region of the heterostructure so that the active region acts as an optical waveguide. Moreover, the isolating material must be a relatively poor conductor since current flow through the isolating material to the substrate would limit the flow of injection current through the active region of the heterostructure. The process used to cover the etched regions with isolating material must also be compatible with the crystal structure of the heterostructure to avoid degradation of the heterostructure during planarization.

Dutta et al have filled channels isolating a InP-InGaAsP buried heterostructure laser by masking regions adjacent the channels with a layer of $SiO_2$, and selectively growing Fe-doped InP in the exposed channels using metalorganic vapour phase epitaxy (MOVPE) growth processes (*Appl. Phys. Lett.* 48 (23), pp. 1572–1573, June 9, 1986; *Appl. Phys. Lett.* 50 (11), pp. 644–646, Mar. 16, 1987). The Fedoped InP acts as a semi-insulator to inhibit flow of current through the filled channels, and has the required refractive index and crystal compatibility properties. However, Nakahara et al have shown that MOVPE-grown Fe-doped InP contains Fe-P precipitates which may degrade the long term reliability of such lasers (J. Crystal Growth 72, p.693, 1985). Moreover, unlike Liquid Phase Epitaxy (LPE) growth processes, MOVPE growth processes tend to produce a nonplanar epitaxial layer.

Unfortunately, LPE growth of Fe-doped InP requires temperatures exceeding 850 degrees Celsius to obtain adequate solubility of the Fe dopant in the InP melt, and temperatures exceeding 650 degrees Celsius damage the heterostructure to be isolated.

Rezek et al reported LPE growth of Co-doped semi-insulating InP at temperatures as low as 635 degrees Celsius (*Appl. Phys. Lett.* 43 (4), pp. 378–380, Aug. 15, 1983). However, later reports indicated that the LPE growth of Co-doped and Ni-doped semi-insulating InP is plagued by the formation of Co-P and Ni-P precipitates respectively (Proceedings of the 3rd NATO Workshop on Material Aspects of InP, Harwichport Mass., 1986).

Lambert et al reported growth of Ti-Hg co-doped semi-insulating InP ingots by a gradient freeze method (Semicond. Sci. Technol. 2 (1987), pp.78–82). The gradient freeze method is used to grow crystal ingots and is not applicable to the selective epitaxial growth of crystal layers on a substrate since the high melt temperatures used would decompose the substrate. Iseler et al reported growth of Ti-Zn, Ti-Cd and Ti-Be codoped semi-insulating InP boules by the Liquid Encapsulated Czochralski (LEC) method (Appl. Phys. Lett. 48(24), pp.1656–1657, June 16, 1986). The LEC method also is not applicable to the selective epitaxial growth of crystal layers on a substrate since the high melt temperatures used would decompose the substrate.

SUMMARY OF THE INVENTION

The present invention seeks to provide a method for Liquid Phase Epitaxy (LPE) of semi-insulating InP applicable to the selective growth of isolating material on a substrate to isolate the active region of a buried heterostructure semiconductor laser.

More particularly, the present invention seeks to provide a method for Liquid Phase Epitaxy (LPE) of semi-insulating InP which is practicable at a temperature below 650 degrees Celsius and which forms fewer unwanted precipitates than known methods for epitaxial growth of semi-insulating InP.

One aspect of the invention provides a method for Liquid Phase Epitaxy (LPE) of semi-insulating InP, the method comprising cooling a solution of P, Ti and a p-type dopant in molten In in a non-oxidizing ambient at a surface of a substrate to grow an epitaxial layer of doped InP on said surface, the concentration of p-type dopant in said solution being such as to provide a concentration of p-type dopant in the grown epitaxial layer greater than the aggregate concentration of any residual contaminants in the grown epitaxial layer, and the concentration of Ti in said solution being such as to provide a concentration of Ti in the grown epitaxial layer greater than the concentration of p-type dopant in the grown epitaxial layer.

The p-type dopant may be selected from the group consisting of Zn, Cd, Hg, Be and Mg, and is preferably Zn.

Thus, a preferred embodiment of the invention provides a method for Liquid Phase Epitaxy (LPE) of semi-insulating InP, comprising cooling a solution of P, Ti and Zn in molten In in a non-oxidizing ambient at a surface of a substrate to grow an epitaxial layer of doped InP on said surface, the concentration of Zn in said solution being such as to provide a concentration of Zn in the grown epitaxial layer greater than the aggregate concentration of any residual contaminants in the grown epitaxial layer, and the concentration of Ti in said solution being such as to provide a concentration of Ti in the grown epitaxial layer greater than the concentration of Zn in the grown epitaxial layer.

The LPE method of the preferred embodiment is practicable at temperatures below 650 degrees Celsius and forms fewer unwanted precipitates than previously reported methods for LPE of semi-insulating InP.

Moreover, the LPE method of the preferred embodiment is easier to control than MOVPE methods, and is compatible with selective epitaxial growth of semi-insulating InP to isolate an active region of a buried heterostructure semiconductor laser unlike previously reported gradient freeze and LEC methods for growth of semi-insulating InP ingots and boules.

Accordingly, another aspect of the invention provides a method of making a buried heterostructure semiconductor laser, comprising:

growing an InP-InGaAsP heterostructure on an InP substrate;

removing regions of the heterostructure to define a mesa;

growing a layer of semi-insulating InP adjacent the mesa by LPE to electrically isolate the mesa;

forming electrical contacts to the mesa and to the substrate; and forming reflective end facets on the mesa.

Preferably, a layer of Ti-Zn codoped semi-insulating InP is grown in the channels by LPE at temperatures below 650 degrees Celsius.

Thus, yet another aspect of the invention provides a buried heterostructure semiconductor laser, comprising:

an InP substrate;

a series of epitaxial layers on said substrate defining a heterostructure having reflective end facets;

a layer of Ti-Zn codoped semi-insulating InP adjacent the heterostructure electrically isolating said heterostructure; and electrical contacts to the isolated region of the heterostructure and to the substrate.

BRIEF DESCRIPTION OF THE DRAWINGS

Embodiments of the invention are described below by way of example only with reference to the accompanying drawings, in which.

DETAILED DESCRIPTION OF EXAMPLE EMBODIMENTS

Figure 1A:
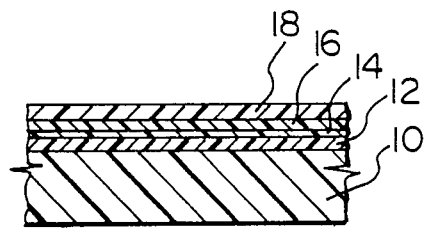
FIGS. 1a to 1d are cross-sectional views of a buried heterostructure semiconductor laser at successive steps of its fabrication by methods according to embodiments of the invention.

In the fabrication of a buried heterostructure semiconductor laser, an n-type InP epitaxial layer 12, an n-type InGaAsP epitaxial layer 14, a p-type InP epitaxial layer 16 and a p-type InGaAsP epitaxial layer 18 are successively grown on an n-type InP substrate 10 to define a heterostructure as shown in FIG. 1a. The epitaxial layers may be grown by Liquid Phase Epitaxy (LPE), MetalOrganic Vapour Phase Epitaxy (MOVPE), Molecular Beam Epitaxy (MBE) or any other suitable epitaxial growth technique.

Figure 1B:
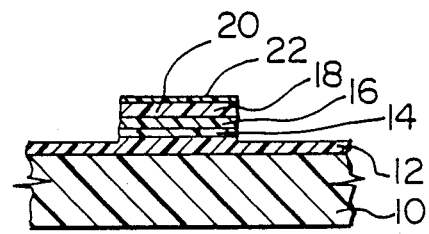

A surface region of the p-type InGaAsP epitaxial layer 18 is masked and adjacent regions of the epitaxial layers 12, 14, 16, 18 are removed by chemical etching to define a mesa 20, as shown in FIG. 1b.

Figure 1C:
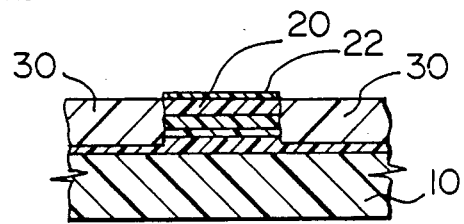

A layer 30 of Ti-Zn codoped semi-insulating InP is selectively grown adjacent the mesa, as shown in FIG. 1c, by a Liquid Phase Epitaxy (LPE) process described below. The LPE process is carried out at temperatures below 650 degrees Celsius to avoid damage to the other epitaxial layers 12, 14, 16, 18 defining the heterostructure. A SiO$_2$ mask 22 may be used to prevent growth of the layer 30 on the mesa 20. The layer 30 is grown to substantially the same height as the mesa 20 to planarize the structure. The semi-insulating material of the layer 30 electrically isolates the mesa 20.

Figure 1D:
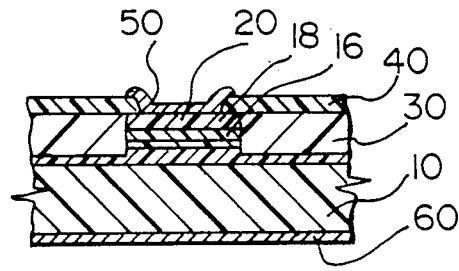

A SiO$_2$ dielectric layer 40 is formed on the upper surface of the resulting structure, a contact hole is opened through the dielectric layer 40 over the mesa 20, and an AuZ-n layer 50 is deposited over the contact hole to form an electrical contact to the mesa 20, as shown in FIG. 1d. The p-type InGaAsP layer 18 permits formation of an ohmic contact to the underlying p-type InP layer 16.

An Au-Ge layer 60 is deposited on the back surface of the substrate 10 to form an electrical contact to the substrate 10, as shown in FIG. 1d. Material may be removed from the back of the substrate 10 before deposition of the Au-Ge layer 60 to reduce the series resistance of the resulting laser. Reflective end facets are cleaved to complete the laser fabrication.

Figure 2:
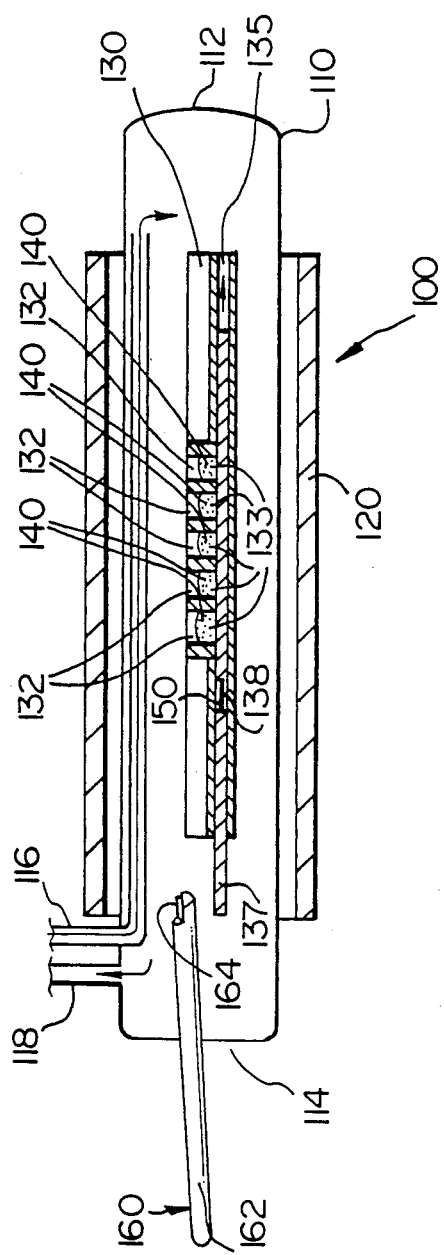
FIG. 2 is a schematic cross-sectional view of apparatus used in the performance of methods according to the embodiments.

The LPE growth of the Ti-Zn codoped semi-insulating InP layer 30 is carried out in apparatus 100 shown schematically in FIG. 2. The apparatus 100 comprises a quartz tube 110 which is sealed at one end 112 and open at another end 114. The tube 110 is provided with a gas inlet 116 and a gas outlet 118, and a removable cover (not shown) for sealing the open end 114. A source of Pd purified H$_2$ (not shown) is connected to the gas inlet 116 to maintain a non-oxidizing ambient in the tube 110.

The tube 110 is surrounded by a heating element 120 connected to a temperature monitoring and control system (not shown) which permits precise control of the temperature within the tube 110.

The tube 110 carries a graphite boat 130 having a plurality of compartments 132 for containing growth melts 140. Each of the compartments 132 has a bottom opening 133 which communicates with a slider channel 135 extending along the boat 130. The slider channel 135 slidably receives a graphite slider 137 which includes a wafer recess 138 for carrying a crystal wafer 150. Sliding movement of the slider 137 along the slider channel 135 aligns the wafer recess 138 successively with the bottom openings 133 of each compartment 132 to bring the crystal wafer 150 into successive contact with each of the growth melts 140.

A loading device 160 in the form of a quartz rod 162 having a hollow recess 164 at one end is provided for loading compartments 132 without removing the boat 130 from the tube 110.

In a method according to a first embodiment for LPE of semi-insulating InP, a solid sample of In of 6N+purity is etched in 50% distilled water and 50% HNO$_3$ for 5 minutes to remove surface oxides and other surface contaminants. The etched In sample is then rinsed with distilled water, rinsed with CH$_3$OH and dried in a N$_2$ cabinet.

Immediately after drying, the In sample is inserted into a compartment 132 of the graphite boat 130, and the graphite boat 130 is inserted into the quartz tube 110. Pd purified H$_2$ is supplied to the quartz tube 110 via the gas inlet 116 for 1.5 hours to purge the quartz tube 110 of oxidizing gases. The temperature of the quartz tube 110 is then raised to 700 degrees Celsius to melt the In sample in a Pd purified H$_2$ ambient. The resulting In melt is baked at 700 degrees Celsius in a Pd purified H$_2$ ambient for 20 hours to drive impurities from the In melt and cooled to room temperature to resolidify the In.

A piece of Zn-doped InP having a carrier concentration of approximately $5 \times 10^{18}$ cm$^{-3}$ and a piece of undoped InP are each etched in 2% Br$_2$:CH$_3$OH to remove surface oxides and other surface contaminants, rinsed in $CH_3OH$ and dried in a $N_2$ cabinet. A piece of Ti wire of 4N purity is scraped with a surgical blade to remove surface oxides. The quartz tube 110 is purged with high purity $N_2$ gas, and the etched InP and the deoxidized Ti wire are immediately added to the compartment 132 containing the In without removing the graphite boat 130 from the quartz tube 110. The quartz rod 162 is used to place the etched InP and deoxidized Ti in the compartment 132.

A crystal wafer 150 is inserted into the wafer recess 138 of the slider 137. The crystal wafer 150 comprises an InP substrate 10 carrying epitaxial layers 12, 14, 16, 18 defining a heterostructure mesa 20 as shown in FIG. 1b. The high purity $N_2$ gas flow is maintained during the addition of the InP and Ti wire, and during the insertion of the crystal wafer to maintain the non-oxidizing ambient in the quartz tube 110.

The quartz tube 110 is purged with Pd purified $H_2$ for 1.5 hours. The temperature of the quartz tube 110 is then raised to 660 degrees Celsius for one hour to melt the In, InP and Ti. The Pd purified $H_2$ gas flow is maintained during heating of the resulting melt to maintain the nonoxidizing ambient in the quartz tube 110.

The resulting melt comprises a solution of P, Ti and Zn in molten In. The weight and carrier concentration of the Zn-doped substrate, the weight of the undoped InP substrate and the weight of the Ti wire are selected to provide a Zn concentration of $6 \times 10^{-7}$ moles of Zn per mole of In, a Ti concentration of $1.2 \times 10^{-4}$ moles of Ti per mole of In and a P concentration of $6.54 \times 10^{-3}$ moles of P per mole of In in the solution.

The temperature of the quartz tube 110 is then reduced to 635.5 degrees Celsius, and the slider 137 is advanced along the slider channel 135 to bring the crystal wafer 150 into contact with the melt. The temperature of the quartz tube 110 is further lowered at 0.12 degrees Celsius per minute to cause selective LPE growth of Ti-Zn codoped InP layers adjacent the mesa 20 on the substrate 10. The LPE growth is continued until the Ti-Zn codoped InP is grown to substantially the same height as the mesa 20. The slider 137 carrying the crystal wafer 150 is then withdrawn to separate the crystal wafer 150 from the growth melt, and the remaining laser fabrication steps are performed as described above.

In a method according to a second embodiment for LPE of semi-insulating InP, a solid sample of In of 6N+purity is etched in 50% distilled water and 50% $HNO_3$ for 5 minutes to remove surface oxides and other surface contaminants. The etched In sample is then rinsed with distilled water, rinsed with $CH_3OH$ and dried in a $N_2$ cabinet.

Immediately after drying, the In sample is inserted into a compartment 132 of the graphite boat 130, and the graphite boat 130 is inserted into the quartz tube 110. Pd purified $H_2$ is supplied to the quartz tube 110 via the gas inlet 116 for 1.5 hours to purge the quartz tube 110 of oxidizing gases. The temperature of the quartz tube 110 is then raised to 700 degrees Celsius to melt the In sample in a Pd purified $H_2$ ambient. The resulting In melt is baked at 700 degrees Celsius in a Pd purified $H_2$ ambient for 20 hours to drive impurities from the In melt. The quartz tube 110 is then cooled to room temperature to resolidify the In.

A piece of Ti wire of 4N purity is scraped with a surgical blade to remove surface oxides and a piece of undoped InP is etched in 2% $Br_2:CH_3OH$ to remove surface oxides and other surface contaminants, rinsed in $CH_3OH$ and dried in a $N_2$ cabinet. The quartz tube 110 is purged with high purity $N_2$ and the etched InP and the deoxidized Ti wire are immediately added to the In in the compartment 132 without removing the graphite boat 130 from the quartz tube 110. The quartz rod 162 is used to place the InP and Ti in the compartment 132. The high purity $N_2$ flow is maintained during addition of the InP and Ti wire to maintain the nonoxidizing ambient in the quartz tube 110.

The quartz tube 110 is purged with Pd purified $H_2$ for 1.5 hours. The temperature of the quartz tube 110 is then raised to 660 degrees Celsius to melt the In, InP and Ti, and, the resulting melt is maintained at 660 degrees Celsius for 5 hours to dissolve the added InP and Ti in the In, and to drive some of the dissolved Ti into walls of the compartment 132. The Pd purified $H_2$ flow is maintained during baking to maintain the nonoxidizing ambient in the quartz tube 110.

The weight of the Ti wire is selected to provide a Ti concentration of $7.2 \times 10^{-4}$ moles of Ti per mole of In, and the weight of the InP is selected to provide a P concentration of $6.54 \times 10^{-3}$ moles of P per mole of In in the melt.

When the five hour bake is complete, the melt is removed from the graphite boat 130, leaving Ti in the walls of the compartment 132 which contained the melt.

Another solid sample of In of 6N+purity is etched in 50% distilled water and 50% $HNO_3$ for 5 minutes to remove surface oxides and other surface contaminants. The etched In sample is then rinsed with distilled water, rinsed with $CH_3OH$ and dried in a $N_2$ cabinet.

Immediately after drying, the In sample is inserted into the same compartment 132 of the graphite boat 130 used for the previous melt, and the graphite boat 130 is inserted into the quartz tube 110 Pd purified $H_2$ is supplied to the quartz tube 110 via the gas inlet 116 for 1.5 hours to purge the quartz tube 110 of oxidizing gases. The temperature of the quartz tube 110 is then raised to 700 degrees Celsius to melt the In sample in a Pd purified $H_2$ ambient. The resulting In melt is baked at 700 degrees Celsius in a Pd purified $H_2$ ambient for 20 hours to drive impurities from the In melt and to draw Ti from the walls of the compartment 132 into the melt. The quartz tube 110 is then cooled to room temperature to resolidify the melt.

A piece of Zn-doped InP having a carrier concentration of approximately $5 \times 10^{18}$ cm$^3$ and a piece of undoped InP are each etched in 2% $Br_2:CH_3OH$ to remove surface oxides and other surface contaminants, rinsed in $CH_3OH$ and dried in a $N_2$ cabinet. The quartz tube 110 is purged with high purity $N_2$ and the etched InP pieces are immediately added to the compartment 132 containing the resolidified melt without removing the graphite boat 130 from the quartz tube 110. The quartz rod 162 is used to place the InP pieces in the compartment 132.

A crystal wafer 150 is then inserted into the wafer recess 138 of the slider 137. The crystal wafer 150 comprises an InP substrate 10 carrying epitaxial layers 12, 14, 16, 18 defining a heterostructure mesa 20 as shown in FIG. 1b.

The high purity $N_2$ gas flow is maintained during the addition of the InP pieces and during the insertion of the crystal wafer 150 to maintain the non-oxidizing ambient in the quartz tube 110.

The quartz tube 110 is purged with Pd purified $H_2$ for 1.5 hours. The temperature of the quartz tube 110 is then raised to 660 degrees Celsius to melt the resolidified melt and the added InP, and the resulting melt is maintained at 660 degrees Celsius for one hour to dissolve the added InP in the resulting melt. The Pd purified $H_2$ gas flow is maintained during heating of the resulting melt to maintain the non-oxidizing ambient in the quartz tube 110.

The resulting melt comprises a solution of P, Ti and Zn in molten In. The weight and carrier concentration of the Zn-doped substrate and the weight of the undoped InP substrate are selected to provide a Zn concentration of $6 \times 10^{-7}$ moles of Zn per mole of In and a P concentration of $6.54 \times 10^{-3}$ moles of P per mole of In in the solution. The weight of the Ti wire used in the previous melt and the baking time and temperature of the previous melt are selected to provide a Ti concentration of approximately $1.2 \times 10^{-4}$ moles of Ti per mole of In in the second melt.

The temperature of the quartz tube 110 is then reduced to 635.5 degrees Celsius, and the slider 137 is advanced along the slider channel 135 to bring the crystal wafer 150 into contact with the melt. The temperature of the quartz tube 110 is further lowered at 0.12 degrees Celsius per minute to cause selective LPE growth of Ti-Zn codoped InP layers adjacent the mesa 20 on the substrate 10. The LPE growth is continued until the Ti-Zn codoped InP is grown to substantially the same height as the mesa 20. The slider 137 carrying the crystal wafer 150 is then withdrawn to separate the crystal wafer 150 from the growth melt, and the remaining laser fabrication steps are performed as described above.

The Ti-Zn codoped InP layer 30 grown by the LPE processes described above is a semi-insulating layer effective for electrically isolating the mesa 20. Zn ions in the Ti-Zn codoped InP accept conduction band electrons contributed by predominantly n-type residual contaminants in the InP. The Zn concentration in the grown epitaxial layer 30 is greater than the concentration of residual contaminants in the grown epitaxial layer 30, so the Zn ions contribute a net concentration of valence band holes. The Ti ions contribute electrons which fill the remaining valence band holes provided by the Zn ions. The Ti concentration in the grown epitaxial layer 30 is greater than the Zn concentration in the grown epitaxial layer 30, so that electrons contributed by the Ti ions fill essentially all of the remaining valence band holes provided by the Zn ions. The Ti energy levels are sufficiently far from the conduction and valence band edges in InP that excess Ti atoms contribute very few mobile electrons to the conduction band. The scarcity of mobile carriers accounts for the semi-insulating properties of the LPE grown Ti-Zn codoped InP layer 30.

To ensure that the LPE grown Ti-Zn doped InP is semi-insulating, the concentrations of Zn used in the growth melt must be selected so as to ensure that the concentration of Zn in the grown epitaxial layer is greater than the aggregate concentration of any residual contaminants in the grown epitaxial layer, and the concentration of Ti used in the growth melt must be selected so as to ensure that the concentration of Ti in the grown epitaxial layer is greater than the concentration of Zn in the grown epitaxial layer. Suitable growth melt concentrations can be determined empirically by growth of sample crystals. InP layers can be grown by LPE from melts having increasing Zn concentrations until Hall Effect measurements indicate that p-type InP has been obtained in order to determine the growth melt concentration of Zn required to provide an epitaxial layer having a Zn concentration which exceeds the aggregate concentration of residual n-type contaminants. InP layers can then be grown by LPE from melts having the determined Zn concentration and increasing Ti concentrations until conductivity measurements indicate that semi-insulating InP has been obtained in order to determine the growth melt concentration of Ti required to an epitaxial layer having a Ti concentration which exceeds the Zn concentration.

The required melt concentrations may vary if starting materials or growth conditions are altered. For typical starting materials and growth conditions, the Zn concentration in the melt must be at least $4 \times 10^{-7}$ moles of Zn per mole of In and the Ti concentration must be at least 200 times the concentration of Zn in the melt.

Other p-type dopants could be substituted for Zn. For example, Cd, Hg, Be and Mg should all act as p-type dopants in InP. Zn is preferred because of its relatively low vapour pressure in the LPE growth melt at temperatures around 650 degrees Celsius and its limited tendency to migrate in InP at the temperatures used for epitaxial growth and subsequent processing. The relatively high vapour pressures for Cd and Hg in the LPE growth melt, the toxicity of Be and the sensitivity of Mg to oxidation make these materials less attractive for use as p-type dopants in LPE growth of semi-insulating InP.

In the processes described above, it is important to avoid oxidation of Ti since $Ti_2O_3$ is extremely stable and will precipitate out of the growth melt, excluding Ti from the LPE grown InP. In this case, the LPE grown InP may not be semi-insulating. Chemical etching of the In sample, baking of the growth melts, use of non-oxidizing high purity $N_2$ and Pd purified $H_2$ ambients, scraping of the Ti wire, and insertion of the Zn-doped InP, undoped InP and scraped Ti wire without removing the boat 130 from the tube 110 all help to reduce oxide contamination. Moreover, use of a Zn-doped InP substrate as a source of Zn in the growth melt avoids contamination by metallic oxides which would be difficult to eliminate if metallic Zn or an In:Zn alloy were used as a source of Zn.

I claim:

1. A method for Liquid Phase Epitaxy (LPE) of semi-insulating InP, comprising cooling a solution of P, Ti and a p-type dopant in molten In in a non-oxidizing ambient at a surface of a substrate to grow an epitaxial layer of doped InP on said surface, the concentration of p-type dopant in said solution being such as to provide a concentration of p-type dopant in the grown epitaxial layer greater than the aggregate concentration of any residual contaminants in the grown epitaxial layer, and the concentration of Ti in said solution being such as to provide a concentration of Ti in the grown epitaxial layer greater than the concentration of p-type dopant in the grown epitaxial layer.

2. A method as defined in claim 1, wherein the p-type dopant is selected from the group consisting of Zn, Cd, Hg, Be and Mg.

3. A method for Liquid Phase Epitaxy (LPE) of semi-insulating InP, comprising cooling a solution of P, Ti and Zn in molten In in a non-oxidizing ambient at a surface of a substrate to grow an epitaxial layer of doped InP on said surface, the concentration of Zn in said solution being such as to provide a concentration of Zn in the grown epitaxial layer greater than the aggregate concentration of any residual contaminants in the grown epitaxial layer, and the concentration of Ti in said solution being such as to provide a concentration of Ti in the grown epitaxial layer greater than the concentration of Zn in the grown epitaxial layer.

4. A method as defined in claim 3, comprising providing the solution by melting In, Zn doped InP and deoxidized Ti in a non-oxidizing ambient.

5. A method as defined in claim 4, further comprising melting undoped InP with the In, Zn doped InP and deoxidized Ti.

6. A method as defined in claim 4, further comprising baking the molten In in a non-oxidizing ambient to drive impurities from the molten In and resolidifying the In before melting it with the Zn-doped InP and deoxidized Ti.

7. A method as defined in claim 4, comprising etching the In to remove surface contaminants immediately before melting the In.

8. A method as defined in claim 4, comprising etching the Zn-doped InP to remove surface contaminants immediately before melting it with the In.

9. A method as defined in claim 5, comprising etching the undoped InP immediately before melting it with the Zn-doped InP, Ti and In.

10. A method as defined in claim 3, comprising providing the solution by:
melting In, deoxidized Ti and undoped InP in a graphite vessel in a non-oxidizing ambient to form a first melt;
baking the first melt in a non-oxidizing ambient to drive Ti into walls of the graphite vessel;
removing the first melt from the graphite vessel;
melting In in the graphite vessel in a nonoxidizing ambient to form a second melt, baking the second melt in a non-oxidizing ambient to draw Ti from the walls of the graphite vessel into the second melt and resolidifying the second melt; and
melting undoped InP and Zn-doped InP with the resolidified second melt in a non-oxidizing ambient.

11. A method as defined in claim 10, comprising baking the first melt at 660 degrees Celsius for 5 hours to drive Ti into the walls of the graphite vessel and baking the second melt at 700 degrees Celsius for 20 hours to draw Ti from the walls of the qraphite vessel into the resulting melt.

12. A method as defined in claim 11, comprising providing $7.2 \times 10^{-4}$ moles of deoxidized Ti and $6.54 \times 10^{-3}$ moles of P in the first melt for each mole of In in the first melt.

13. A method as defined in claim 10, comprising forming the first melt by:
melting In in a non-oxidizing ambient;
baking the molten In in a non-oxidizing ambient to drive impurities from the molten In;
resolidifying the molten In; and
melting the resolidified In with deoxidized Ti and undoped InP.

14. A method as defined in claim 13, comprising etching the In to remove surface contaminants immediately before melting and baking the In.

15. A method as defined in claim 10, comprising etching the undoped InP and Zn-doped InP to remove surface contaminants immediately before melting them.

16. A method for Liquid Phase Epitaxy (LPE) of semiinsulating InP, comprising cooling a solution of P, Ti and Zn in molten In in a non-oxidizing ambient at a surface of a substrate to grow an epitaxial layer of doped InP on said surface, the concentration of Zn in said solution being at least $4 \times 10^{-7}$ moles per mole of In, and the concentration of Ti in said solution being at least 200 times the concentration of Zn in said solution.

17. A method as defined in claim 16, wherein the concentration of Zn in said solution is $6 \times 10^{-7}$ moles of Zn per mole of In, the concentration of Ti in said solution is $1.2 \times 10^{-4}$ moles of Ti per mole of In, and the concentration of P in said solution is $6.54 \times 10^{-3}$ moles of P per mole of In. $1.2 \times 10^{-4}$ moles of Ti per mole of In, and the concentration of P in said solution is $6.54 \times 10^{-3}$ moles of P per mole of In.

18. A method of making a buried heterostructure semiconductor laser, comprising:
growing an InP-InGaAsP heterostructure on an InP substrate;
removing regions of the heterostructure to define a mesa;
growing a layer of semi-insulating InP adjacent the mesa by a LPE method comprising cooling a solution of p-type dopant in molten In in a non-oxidizing ambient, to electrically isolated the mesa;
forming electrical contacts to the mesa and to the substrate; and
forming reflective end facets on the mesa.

19. A method as defined in claim 17, comprising growing a layer of Ti-Zn codoped semi-insulating InP adjacent the mesa by LPE at temperatures below 650 degrees Celsius.

* * * * *